United States Patent

[11] 3,579,143

[72] Inventor William H. Haydl
Tarzana, Calif.
[21] Appl. No. 780,037
[22] Filed Nov. 29, 1968
[45] Patented May 18, 1971
[73] Assignee North American Rockwell Corporation

[54] METHOD FOR INCREASING THE EFFICIENCY OF LSA OSCILLATOR DEVICES BY UNIFORM ILLUMINATION
3 Claims, 6 Drawing Figs.

[52] U.S. Cl. .......... 331/107G, 307/311, 317/234V
[51] Int. Cl. .......... H03b 7/00
[50] Field of Search .......... 331/107 (G); 317/234/10; 307/311

[56] References Cited

UNITED STATES PATENTS 3,435,307 3/1969 Landauer .......... 331/107(G)X
3,440,425 4/1969 Hutson et al .......... 331/107(G)X

FOREIGN PATENTS 1,119,090 7/1968 Great Britain .......... 331/107G

OTHER REFERENCES

Copeland (1), IEEE Transactions on Electron Devices, September 1967, pp. 461— 463. (331- 107G)

Copeland (2), IEEE Transactions on Electron Devices, September 1967, pp. 497— 500. (331- 107G)

Copeland (3), Proceedings of the IEEE, October 1966, pp. 1479— 1480. (331- 107G)

*Primary Examiner*—Roy Lake
*Assistant Examiner*—Siegfried H. Grimm
*Attorneys*—Joseph E. Kieninger, L. Lee Humphries, H. Frederick Hamann and Henry Kolin

ABSTRACT: The frequency of oscillations can be controlled by applying uniform illumination to at least one surface of photoconducting semiconductors which exhibit a negative differential conductivity and traveling regions of space charge. The method is particularly useful in Gunn effect devices utilizing gallium arsenide (GaAs), but applies also to other photoconducting semiconductors exhibiting the Gunn effect and also to piezoelectric semiconductors exhibiting traveling domains due to acousto-electric interactions between acoustic waves and the charge carriers. Also described is a principle for reducing the fluctuations in the carrier density present in the crystalline semiconductor solid by reducing the inhomogeneities as a percentage of the total carrier density by uniformly illuminating the crystal. The reduction in the present fluctuations in the carrier density is of particular significance in gallium arsenide Gunn devices operating in the LSA mode.

INVENTOR.
WILLIAM H. HAYDL

BY

ATTORNEY

INVENTOR.
WILLIAM H. HAYDL
BY
ATTORNEY

METHOD FOR INCREASING THE EFFICIENCY OF LSA OSCILLATOR DEVICES BY UNIFORM ILLUMINATION

BACKGROUND OF THE INVENTION

Traveling high electric field domains have been observed in a number of semiconductors and are a consequence of a negative differential conductivity. The domains travel periodically through the sample and result in current oscillations. These current oscillations have been observed and the domains and the electric field distribution have been probed in a number of semiconductors. Two distinct groups of semiconductors should be considered. In the first the domain travels at the velocity of the drifting electrons which is about $10^7$ cm./sec., and the effect is known as the Gunn effect. In the second domains travel at the velocity of sound which is of the order of $10^5$ cm./sec., and the effect is due to the acousto-electric interaction between acoustic waves and the carriers.

High electric field domains are generated in the sample and travel with the charge carriers to the anode, in the case of an *n*-type semiconductor. Only *n*-type semiconductors are considered in this discussion, although the principles also hold true for *p*-type semiconductor material. The oscillation period is equal to the time required for a domain to propagate from the cathode to the anode. The frequency of oscillation (or the period) can be altered if the distance the domain travels is varied. The domain may be made to collapse anywhere in the crystal where the field is made sufficiently low. The field for domain formation is higher than the field to sustain a propagating domain. Therefore, if the field has a value below that required to sustain the field, the domain will not be able to exist. However, if the field is maintained at a value above the sustaining value, the domain can propagate.

One of the principal problems presently existing in growing GaAs single crystals by the vapor-transport method, the solution method, or any other method, is the presence of inhomogeneities in the single crystals and particularly inhomogeneities such as number of dislocations, carrier mobility and carrier density, traps and other similar properties of the material. Of all these, the most prominent also the most undesirable are inhomogeneities in the carrier density. Since the spatial distribution of the carrier density determines the spatial distribution of the electric field when ohmic conditions prevail, and since in the case of the Gunn effect mode and especially in the case of the LSA operating mode, uniform electric field and carrier density distributions are desired, a means to obtain such uniformity throughout a device is highly desirable. Since inhomogeneities in the carrier density result in inhomogeneities in the ohmic electric field distribution along a Gunn or an LSA operating mode device, domains, charge accumulation and/or depletion regions will form at regions of higher electric field and this may result in incoherent current oscillations. Similarly, domains may be forced to collapse when they enter a region of high carrier density and low electric field. In such a case only part of the sample is useful as an oscillator, the rest is simply a resistor dissipating energy which results in a decreased efficiency.

The LSA mode is capable of providing very high frequencies, high efficiencies and high powers but is, however, extremely sensitive to fluctuations in the carrier density and therefore the electric field. While RF efficiencies of 18 percent have been predicted by theory, the efficiencies generally observed are only about one-tenth of the predicted value. According to the present view, these low efficiencies result from inhomogeneities in the material. Similarly, but to a lesser extent, the inhomogeneities in the material used for the Gunn effect mode of operation results in lower operating efficiencies.

For the maximum LSA device efficiency there exists a certain relation between the carrier density and the frequency of operation. This relationship is $2\times 10^4 > n/F > 2\times 10^5$, when $n$ is the carrier density and F is the frequency. The operating frequency can, therefore, not be chosen at will but must be generally prescribed within limits for a given piece of GaAs.

SUMMARY OF THE INVENTION

This invention is directed to microwave generating semiconducting devices of photoconducting material operating in either the LSA mode or the usual Gunn effect mode. The inefficiencies in the operation of such devices resulting from the fluctuations in carrier density associated with inhomogeneities in the material are drastically reduced by uniformly illuminating the material to increase the carrier density to the point where the energy dissipation associated with the inhomogeneities is reduced to a very small fraction of the total output.

DESCRIPTION OF THE PREFERRED EMBODIMENT

The primary feature of the present invention is the discovery that illumination uniform over at least one surface of a photosensitive GaAs body can result in a drastic reduction in carrier inhomogeneities. Illumination with light of a certain wavelength will generate carriers (electron hole pairs) decreasing in number exponentially from the surface which is being illuminated.

The term "illumination" as used herein includes all electromagnetic radiation capable of generating carriers throughout the semiconductor and includes thermal radiation as well as bombardment with electrons.

The rate of decrease depends on the frequency of the light used. It has been found that light penetration, and thus carrier generation, is quite deep within the crystal body and fairly uniform carrier densities can be expected as deep as 50 microns. Illumination raises the entire level of the carrier concentration.

Figures 1, 2, 4:
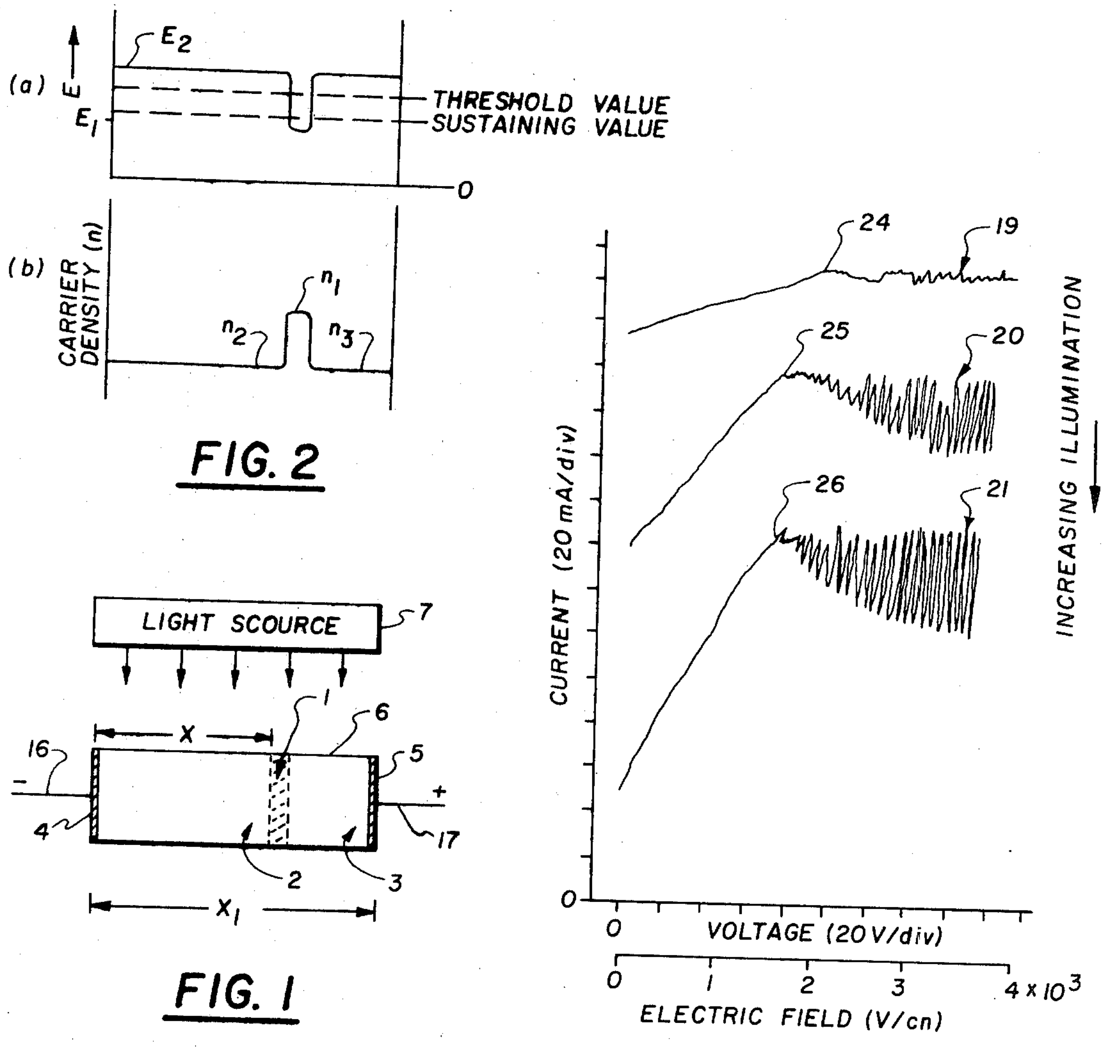
FIG. 1 is a schematic representation of an arrangement illustrating the principles of the present invention.
FIG. 2 is a graphic representation of the field and carrier density characteristics of FIG. 1.
FIG. 4 shows the current-voltage and current-electric field characteristics of a photosensitive GaAs Gunn device for various illuminations.

Consider the simplest case, illustrated in FIG. 1. A photosensitive Gunn device has a region 1 of higher carrier density separating regions 2 and 3 of low carrier density. The region 1 is at a distance $x$ from the cathode 4. If region 1 is sufficiently highly doped (approximately twice or more the doping level of regions 2 and 3), a domain originating at the cathode 4 will travel only the distance $x$. The domain will be annihilated upon entering region 1 because the electric field in region 1 is too low to sustain the domain. The oscillation frequency of such a device will be $$f_{osc.} = \frac{V_D}{x}$$

where $V_D$ is the domain velocity. If at least one surface 6 of the device is uniformly illuminated by light source 7 a certain number of carriers are generated in regions 1, 2 and 3. The relative difference in carrier densities between region 1 and the regions 2 and 3 decreases. If the illumination is sufficiently strong the ratio of carrier densities $n_1/n_{2,3}$ will decrease and become less than about 2. As a result a domain may travel through region 1 without being destroyed and the oscillation frequency then corresponds to $$f_{osc.} = \frac{V_D}{x_1}$$

where $x_1$ is the distance between the cathode 4 and anode 5.

FIG. 2 illustrates the electric field (FIG. 2(*a*)) and carrier density (FIG. 2(*b*)) distributions of the device of FIG. 1. If the carrier density $n_1$ is so high that the electric field $E_1$ falls below the sustaining field value, the domain will be destroyed when it enters the region of 1 (FIG. 1). If, however, $E_1$ is above the sustaining field value, the domain can travel through the region 1 and reach the anode 5. The sustaining field is approximately one-half the threshold field because the peak electron velocity is about twice the valley electron velocity in GaAs.

Figure 3:
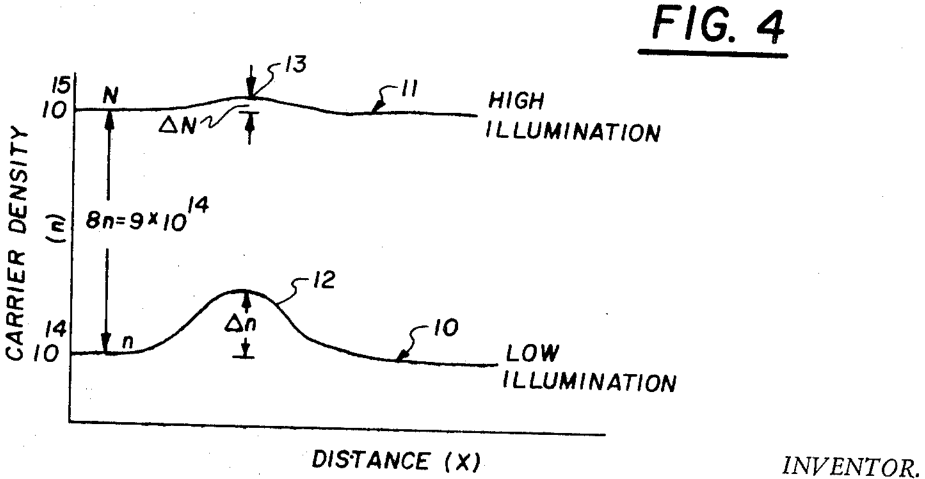
FIG. 3 is a graph of the effect of illumination on the spatial fluctuations in carrier density.

Fig. 3 illustrates the effect illumination has on spatial variations in the carrier density similar to that of FIG. 2(*b*). If the ratio $n_1/n_{2,3}$ is larger than 2 the domain will travel a distance $x$. Illumination will reduce the ratio $n_1/n_2$. Above a definite threshold value of the illumination, the ratios $n_1/n_2$ or $E_2/E_1$ will become less than the value 2 and the oscillation frequency will change since the domain now travels the total distance $x_1$ between cathode 4 and anode 5. It should be noted that the product of $n_2 \cdot x_1$ must be greater than $10^{12}$ in order for the domain to form and cause Gunn effect oscillations.

Referring to FIG. 3 in more detail, an initial carrier density $n$ is shown by curve 10 at low illumination, i.e., dark, while curve 11 shows the increase in carrier density N resulting from illumination, i.e., any illumination resulting in a 10 percent increase in carrier density compared to a dark or unilluminated surface. As FIG. 3 illustrates, a carrier fluctuation of 100 percent shown as the portion 12 of the curve 10, under unilluminated conditions appears as a fluctuation 13 on curve 11 having one-tenth the magnitude when the carrier density is raised by a factor of 10 by uniform illumination. Thus, if the illumination results in the generation of a carrier density which is, for example, two orders of magnitude above the dark carrier density, since these two densities add the fluctuations are correspondingly reduced by about two orders of magnitude. In this manner illumination of material of low carrier density allows the carrier density to be raised to any desirable level. The upper level is, of course, determined by the intensity of the light source. The primary result achieved by illumination is the effective reduction of inhomogeneities to obtain more uniformly active material. This is useful in increasing Gunn effect mode operating efficiencies and is extremely desirable in the case of the LSA mode of operation. The carrier density can be adjusted by the illumination intensity to give the optimum efficiency at a given frequency.

The device geometry desirable for LSA or Gunn effect operating devices is a thin, sheetlike photoconducting semiconductor body having appropriately connecting leads 16 and 17 to which a voltage is applied having a magnitude sufficient to initiate oscillations as shown in FIG. 1. This is the geometry most suitable for uniform illumination since large surface areas may be illuminated. A means 7 for uniformly illuminating one or more surfaces of the body is provided although ambient illumination may be relied upon if it is sufficiently intense and also uniform over at least one surface of the body.

These same principles apply to all photoconducting semiconductors. The principles of generation of carriers with light, the modulation of the carrier density along an oscillating device and thus the corresponding modulation of the current waveform and oscillation frequency, apply also to piezoelectric semiconductors which exhibit traveling domains, is known (see William H. Haydl, "Current Instabilities in Piezoelectric Semiconductors" (PhD thesis) Stanford Univ., 1967). Thus, while the preferred embodiment is directed to GaAs and the Gunn effect operation or LSA mode of operation in this material, any other photoconducting semiconductor exhibiting these effects may be utilized in carrying out the method of the present invention.

The preferred photoconducting semiconductor is gallium arsenide single crystals. As these crystals are available at the present time, they have large dopant inhomogeneities and exhibit large fluctuations in the carrier density. Such characteristics are especially intolerable in the case of the LSA mode of operation and also result in decreased efficiencies in the Gunn effect mode.

It has been found that illumination with light near the bandgap results in a more uniform carrier density distribution throughout the sample. Illumination thus offers a means for obtaining more uniform material by increasing the carrier density of the entire sample and thus reducing the percentage fluctuations in the carrier density. Thus, for example, if the rate of carrier generation due to light is uniform throughout the sample, a variation in the dark carrier density in the range $1—2\times10^{13}$ cm$^{13}$, which represents a 100 percent fluctuation, will be reduced to a 1 percent fluctuation if the carrier density is raised by two orders of magnitude to $1.01—1.0210^{15}$ cm$^{13}$.

Devices are preferably thin, e.g., 50 microns or less, epitaxial films grown on doped semiinsulating GaAs. The substrate may be removed when the active layer is sufficiently thick. Ohmic contacts 4 and 5 are applied to the semiconductor body and the surface illuminated with light from a source 7. When the surface of a Gunn effect operating device was illuminated with monochromatic light from a scanning spectrometer, the sample current began to increase at 9100 A., reached a maximum at 8770 A., and decreased again at shorter wavelengths (the decrease is believed to be caused by surface recombination).

The current oscillations in a 20 micron thick epitaxial layer having a dark carrier concentration of $2\times10^{14}$ cm$^{13}$ at 300° K., a length of 460 microns and a width of 350 microns, are illustrated in FIG. 4. Small amplitude incoherent oscillations were observed in the dark as illustrated by curve 19. With increasing illumination for device resistances of 820 and 580 ohms, see curves 20 and 21, respectively, coherent oscillations were observed. It should also be noted that the instability threshold field indicated by points 24, 25 and 26, respectively, decreases slightly with increasing illumination. The low threshold electric field of about 2000 v./cm., shown in FIG. 4, suggests that variations in the electric field exist along the semiconductor body due, in a large measure, to variations in the carrier density.

Figure 5:
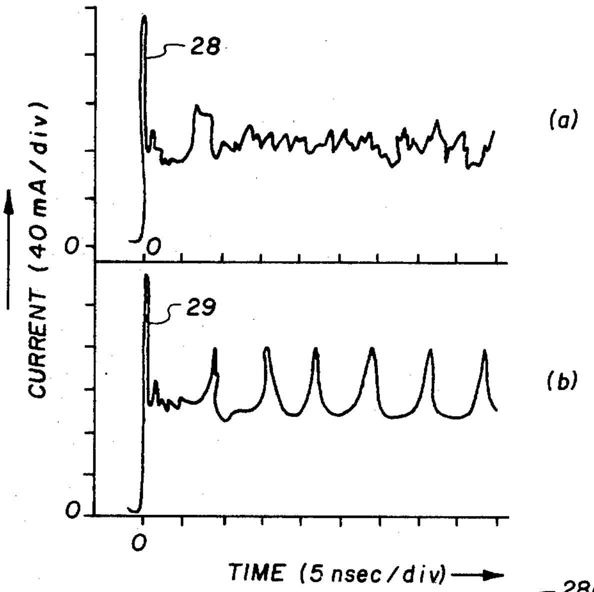
FIG. 5 shows the characteristics of a device exhibiting no coherent current oscillations in FIG. 5(*a*) when dark, and oscillating coherently when illuminated in FIG. 5(*b*)

The current oscillations in a 50 micron thick epitaxial layer are shown in FIG. 5. The device operating in the Gunn effect mode had a dark carrier density of $6\times10^{14}$ cm$^{13}$ at 300° K., a length of 740 microns and width of 315 microns. Incoherent oscillations were observed in the dark as illustrated by curve 28 in FIG. 5(*a*). When the sample was illuminated with an intensity of several watts of white light coherent oscillations appeared as shown in curve 29 of FIG. 5(*b*). FIG. 5(*b*) illustrates that improvements in the oscillations may be obtained in relatively thick samples and that the illumination induced carrier density increase need not be very great.

Figure 6:
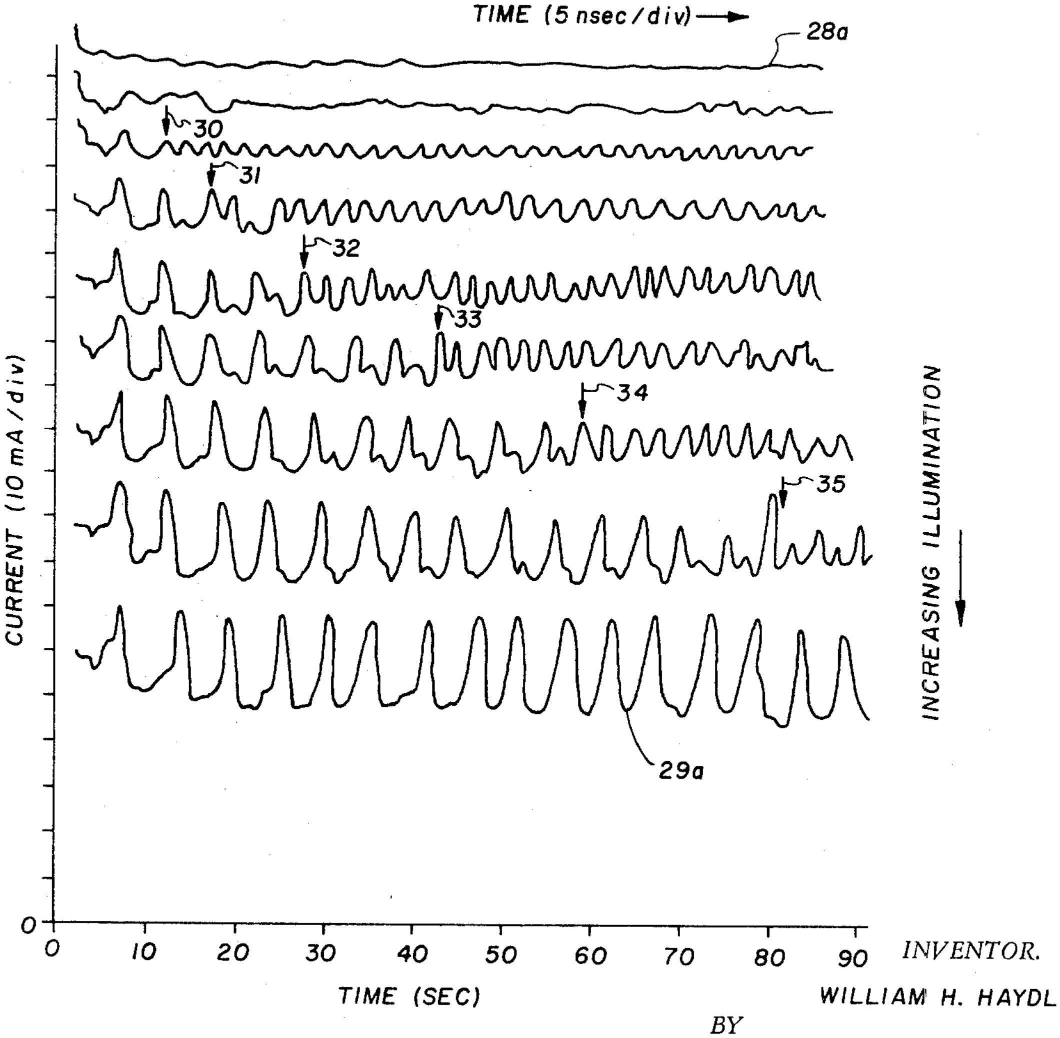
FIG. 6 shows a family of curves showing the reduction of spatial carrier density fluctuation with increased illumination.

FIG. 6 illustrates the effect of illumination on the current oscillations in a sample where impact ionization in a region of that sample is suppressed with increasing illumination. If the domain travels through a region of higher carrier density in which the rate of impact ionization is larger than in the rest of the sample, the conductivity of that region will increase more rapidly with successive passes of the domain through the sample. Eventually the conductivity becomes so high that a new domain is nucleated at the cathode when the old domain reaches this high conductivity (low field) region. A change in the oscillation frequency is then observed, as illustrated in FIG. 6, by the points 30 through 35 on the various curves showing an increase in illumination from dark (curve 28*a*) in incremental increase of approximately 10 percent in the illumination level to curve 29*a*, the latter curve representing an illumination level generating a 200 percent increase in carrier density. Illumination of Gunn effect mode devices allows variations in the carrier density and thus the electric field, and also the effective cross-sectional area. The current wave shape and the amplitude of a number of Gunn devices as well as the frequency have been controlled in this manner. A control of the carrier density over as much as two orders of magnitude will make it possible to operate a single Gunn device in the amplifying, the oscillating, or the LSA mode.

FIG. 6 illustrates the principle of controlling the frequency of a Gunn effect device. If the carrier density in a region of the device is intentionally increased, either by doping, ion implantation, illumination, or by any other process, the carrier density may increase further at high applied voltages due to impact ionization. After a number of cycles (the number of which can be controlled by the intensity of illumination) the oscillation frequency may change because the high conductivity region will stop the propagating domain.

While the above arrangements indicate the principal applications of the method of the present invention, other variations and modifications will be apparent to those skilled in the art. For example, the regions of high carrier density may be spaced along the surface of the device either with equal spacings or with variable spacings. Furthermore, the regions may be formed during the crystal growing process, generated by illumination of the surface through a mask, formed by electron beam bombardment, or produced by ion implantation. It is equally apparent that the more highly doped regions may all have the same conductivity (carrier density) or they may have variations in carrier density along the surface of the semiconductor body. Illumination of one of the more highly doped regions in an arrangement having spaced regions of the same conductivity will cause the frequency of oscillation to change from a value represented by the equation $$f=\frac{V_D}{a}$$

where $a$ is the distance from the cathode to the highly doped region, to one represented by the equation $$f=\frac{V_D}{b}$$

where $b$ is the distance from the cathode to the last spaced region illuminated. In both cases $V_D$ is the domain velocity. Similarly, conductivity of the more highly doped regions spaced along the surface of the semiconductor body may be increased as the distance from the cathode is increased for $n$-type semiconductors. In such a situation a uniform illumination of the surface will then result in a specific frequency output depending upon the dopant level and the illumination level. An increase in the illumination level will decrease the frequency and similarly a decrease in illumination level will increase the frequency.

I claim:

1. A method of increasing the efficiency of a LSA oscillator-type device having microwave oscillations generated by a body portion of said device exhibiting negative differential conductivity and used in combination with a resonant circuit comprising the steps of applying a voltage across said body portion of a photoconducting semiconductor of a magnitude greater than a threshold value to initiate LSA oscillations, selecting a level of illumination and uniformly applying said illumination to said body portion such that the ratio of the carrier density in the illuminated portion of said body portion to the frequency of the LSA oscillations is between about $2\times10^4$ and about $2\times10^5$.

2. A method of increasing the efficiency of a LSA oscillator-type device having microwave oscillations generated by a body portion of said device exhibiting negative differential conductivity and used in combination with a resonant circuit comprising the steps of applying a voltage to spaced electrodes across said body portion of a photoconducting semiconductor of a magnitude greater than a threshold value to initiate LSA oscillations, uniformly illuminating at least one portion of one surface of said body portion to a level sufficient to increase the carrier density in said portion to a value greater than $10^{12}$ divided by said electrode spacing, and maintaining said applied voltage at a value greater than a sustaining value.

3. A method of increasing the efficiency of a LSA oscillator-type device having microwave oscillations generated by a body portion of said device exhibiting negative differential conductivity and used in combination with a resonant circuit comprising the steps of applying a voltage to spaced electrodes across said body portion of a photoconducting semiconductor of a magnitude greater than a threshold value to initiate LSA oscillations, uniformly illuminating at least one portion of one surface of said body portion to a level sufficient to vary the carrier density in said portion to a value sufficient to increase the efficiency of said portion and maintaining said illumination at said level while maintaining said applied voltage at a value greater than an oscillation sustaining value.